TEMPERATURE COMPENSATION CIRCUIT FOR TRANSISTOR AMPLIFIERS

Filed Sept. 10, 1958

INVENTOR.
Robert B. Gelenius
BY
Paul J. Ethington
ATTORNEY

United States Patent Office 3,022,464

Patented Feb. 20, 1962

3,022,464

TEMPERATURE COMPENSATION CIRCUIT FOR TRANSISTOR AMPLIFIERS

Robert B. Gelenius, Flint, Mich., assignor to General Motors Corporation, Detroit, Mich., a corporation of Delaware Filed Sept. 10, 1958, Ser. No. 760,249
4 Claims. (Cl. 330—13)

This invention relates to transistor amplifiers and more particularly to a temperature compensation circuit for such amplifiers.

It is well known that the transistor is a temperature dependent device in which certain parameters vary with temperature change and cause variations in transistor performance. In general, an increase of temperature causes an increase of transistor conductance and output current. In many applications of transistors, it is important that the output current be independent of temperature change. Frequently, transistor amplifiers are employed in pairs, such as in a push-pull or two channel arrangement, and it is desirable to provide temperature compensation for both transistors from a single compensation device.

In accordance with this invention, a temperature responsive circuit is provided for compensation of a pair of transistor amplifiers so that their output currents are independent of temperature variations. This is accomplished by generating compensation voltages which are supplied to the input circuits of the transistors to counteract the effect of temperature variation in their output circuits. The compensating voltages are developed by a single compensating transistor having temperature characteristics corresponding to those of the transistor amplifiers. The compensating transistor has a resistor in its collector circuit which is connected in the input circuit of one of the amplifiers and a resistor in its emitter circuit which is connected in the input circuit of the other amplifier.

Figure 1:
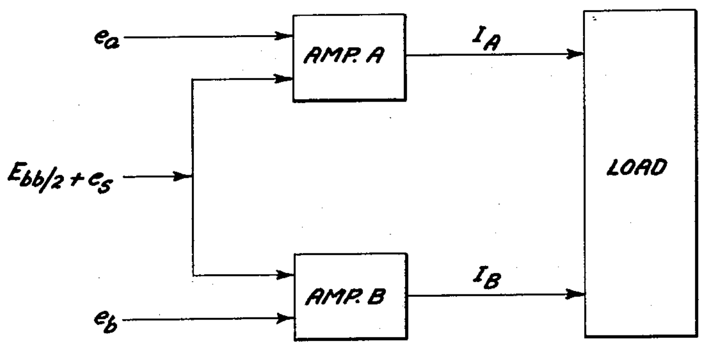
Figure 2:
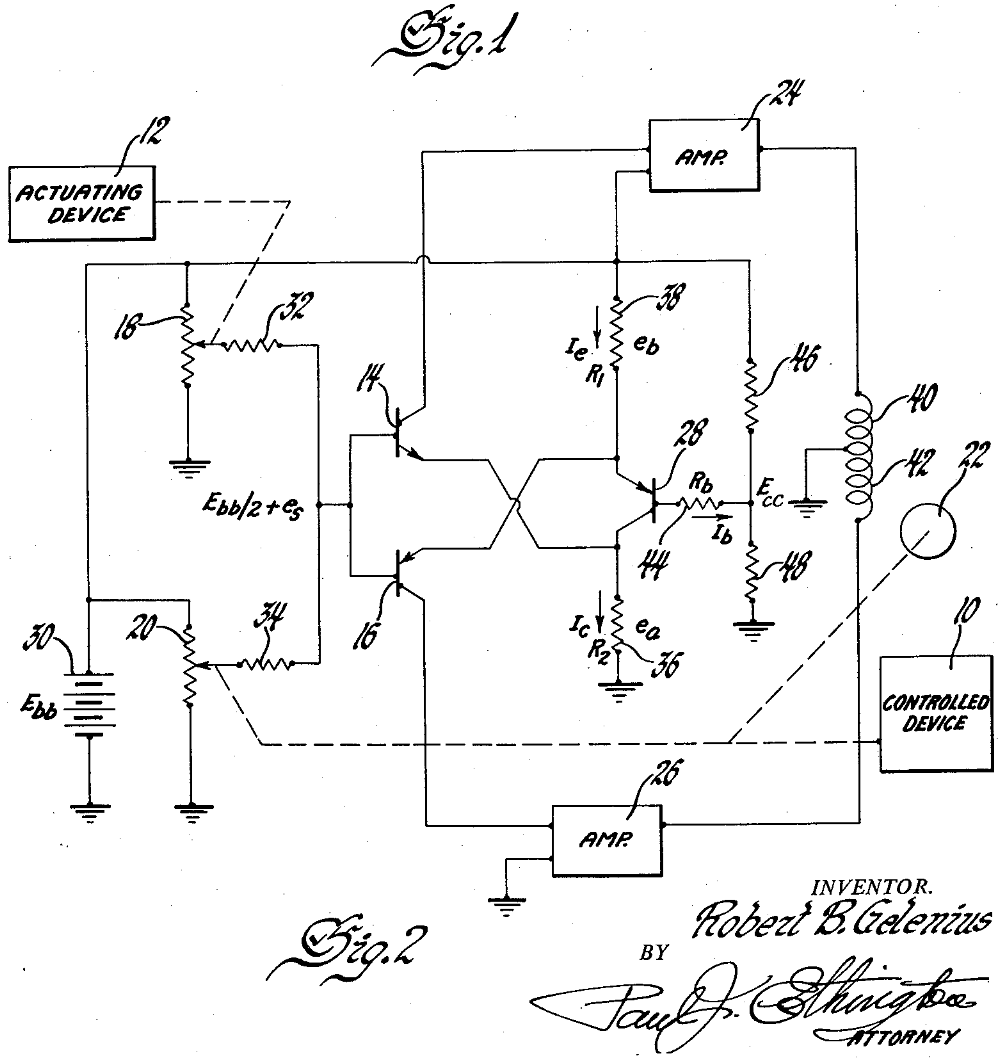

A more complete understanding of this invention may be had from the detailed description which follows taken with the accompanying drawings in which:

FIGURE 1 is a block diagram of an amplifier arrangement which is referred to in the explanation of the invention; and FIGURE 2 is a schematic diagram of an amplifier circuit including the inventive temperature compensation circuit.

Referring now to the drawings, there is shown an illustrative embodiment of the invention in a direct current servo amplifier. As shown in FIGURE 1, the servo amplifier comprises a pair of amplifiers A and B having output circuits which supply currents $I_A$ and $I_B$, respectively, to a common load such as a servo motor. A direct current bias voltage $E_{bb}/2$ and a signal voltage $e_s$ are applied to the input circuits of amplifiers A and B. Compensation voltages $e_a$ and $e_b$ are applied to the respective input circuits of amplifiers A and B. The output currents of the amplifiers may be expressed by the following equations:

$$I_A=K_a(E_{bb}/2+e_s-e_a)+I_a\epsilon^{B(T-T_R)} \qquad (1)$$

$$I_B=K_b(E_{bb}/2+e_s-e_b)+I_b\epsilon^{B(T-T_R)} \qquad (2)$$

where, $K_a$ and $K_b$=constants of proportionality,
$I_a$ and $I_b$=coefficients of leakage current,
$T$=absolute transistor temperature in degrees centigrade,
$T_R$=reference temperature at which $I_a$ and $I_b$ are measured,
$B$=a constant dependent on the transistor material, and
$\epsilon$=the base of Napierian logarithms.

By inspection of Equations 1 and 2, it is apparent that the output current of the amplifiers may be made independent of temperature if the compensation voltages $e_a$ and $e_b$ are caused to be a particular function of temperature. To determine the particular function required, the signal voltage $e_s$ is considered to be zero and both sides of the Equations 1 and 2 are differentiated with respect to temperature holding the currents $I_A$ and $I_B$ constant. This differentiation, with appropriate rearrangement of terms, yields the following expressions for the compensation voltages as a function of temperature:

$$e_a=B\frac{I_a}{K_a}\int\epsilon^{B(T-T_R)}dt+C_a \qquad (3)$$

$$e_b=B\frac{I_b}{K_b}\int\epsilon^{B(T-T_R)}dt+C_b \qquad (4)$$

where, $C_a$ and $C_b$ are the constants of integration.

Referring now to Figure 2, there is shown an illustrative embodiment of this invention in a temperature compensation circuit which generates compensating voltages corresponding to Equations 3 and 4. As a typical application, the temperature compensating circuit is shown in a servo-mechanism in which a controlled device 10 is displaced in correspondence with the displacement of an actuating device 12. The system comprises a pair of direct current transistor amplifiers including transistors 14 and 16 having input circuits which include an input potentiometer 18 and a follow up potentiometer 20. The output circuits of the amplifiers control the energization of a reversible direct current servo motor 22 through succeeding amplifiers 24 and 26. The transistors 14 and 16 are made of the same material to provide similar temperature characteristics. The transistor amplifiers are provided with a temperature compensation circuit including a transistor 28. A single voltage source or battery 30, of voltage $E_{bb}$, supplies all of the voltages required for the system.

Consider now the circuitry of the transistor amplifiers. The input circuit for the transistor 14 extends between the base and emitter electrodes and a bias voltage $E_{bb}/2$ and a signal voltage $e_s$ are developed between the base and ground by the input potentiometer 18 and the follow up potentiometer 20. The input potentiometer 18 is connected across the battery 30 and has its movable contact connected through a resistor 32 to the base of transistor 14 and to the base of transistor 16. Similarly, the follow up potentiometer 20 is connected across the battery 30 and has its movable contact connected through a resistor 34 to the base of transistor 14 and to the base of transistor 16. The resistors 32 and 34 are of equal value. With the actuating device 12 and controlled device in a selected reference position such that the movable contacts of the input potentiometer 18 and follow up potentiometer 20 are positioned at the midpoint of the potentiometer resistors, the voltage applied to the base electrodes is the bias voltage $E_{bb}/2$. The signal voltage $e_s$, developed by displacement of the movable contact of input potentiometer 18, will have a magnitude and polarity depending upon the extent and direction of displacement from the reference position. Therefore, the voltage in the input circuit between the base electrodes and ground is the summation of $E_{bb}/2$ and $e_s$. The input circuit of transistor 14 is completed from emitter to ground through the resistor 36 and the input circuit of transistor 16 is completed from emitter to the upper terminal of battery 30 through the resistor 38. The output circuit for the transistor 14 extends between collector and emitter and is coupled to the input circuit of the amplifier 24. Similarly, the output circuit of transistor 16 extends between collector and emitter and is coupled to the input circuit of amplifier 26. The amplifiers 24 and 26 are connected respectively with the forward and reverse windings 40 and 42 of the servo motor 22. The rotor of the motor 22 is mechanically coupled, as indicated, with the controlled device 10 and the movable contact of the follow up potentiometer 20 for concurrent displacement thereof.

In operation of the system thus far described, an upward displacement in the movable contact of the input potentiometer will increase the input voltage to the transistor 14 and will decrease the input voltage to the transistor 16. Accordingly, the current in the forward winding 40 of the motor 22 will predominate over the current in the reverse winding 42 and the motor will run in the forward direction to displace the controlled device 10 and the movable contact of the follow up potentiometer 20 in the downward direction to reduce the signal voltage $e_s$ to zero and maintain the controlled device in positional correspondence with the actuating device.

In order to generate the temperature compensation voltages in the input circuits of the transistors 14 and 16, a temperature compensating transistor 28 is provided. The base electrode of transistor 28 is connected through a resistor 44 to the junction of voltage divider resistors 46 and 48 which are of equal value and are connected across the battery 30. Thus, an input circuit for the transistor 28 extends between the base electrode and the emitter electrode and includes the voltage developed across resistor 46 as a bias voltage source. The emitter electrode is connected through the resistor 38 to the positive terminal of the battery 30 and the collector electrode is connected through the resistor 36 to ground. Accordingly, an output circuit for the transistor extends between the emitter and collector electrodes and includes the battery 30 in series with the resistors 36 and 38. The transistor 28 is selected to have the same temperature characteristics as the transistors 14 and 16 and has a high current gain. The resistors 36 and 38 are of equal value for current gain of unity in transistor 28 and are proportioned accordingly for current gain less than unity. The voltage on the base electrode causes conduction between the emitter and collector electrodes and the emitter current through the resistor 38 develops a voltage $e_b$ thereacross while the collector current through the resistor 36 develops a voltage $e_a$ thereacross. The transistor 28 has a high current gain and the change in $e_a$ due to a change in collector current is very nearly equal to the change in $e_b$ due to the corresponding change in emitter current. The manner in which the compensation voltages $e_a$ and $e_b$ cause the output currents $I_a$ and $I_b$ of transistors 14 and 16 to be independent of temperature variations will be understood from the following considerations. Referring to FIGURE 2, the following equations may be written:

$$E_{bb}-E_{cc}=I_eR_1+I_bR_b \qquad (5)$$

$$I_c=\alpha I_e+I_T\epsilon^{B(T-T_R)} \qquad (6)$$

$$I_e=I_c+I_b \qquad (7)$$

where, $\alpha$=current gain of transistor 28,
$I_T$=coefficient of leakage current of transistor 28, and where the emitter currents of transistors 14 and 16 are negligibly small in comparison to the total currents in resistors 36 and 38. Simultaneous solution of these equations provides an expression for collector current:

$$I_c=\frac{\alpha(E_{bb}-E_{cc})+(R_1+R_b)I_T\epsilon^{B(T-T_R)}}{R_1+R_b(1-\alpha)} \qquad (8)$$

When the current gain $\alpha$ is very nearly equal to unity, the re-arrangement of Equation 8 provides an expression for the compensating voltage $a_a$:

$$e_a=I_cR_2\cong(R_1+R_b)I_T\epsilon^{B(T-T_R)}+(E_{bb}-E_{cc}) \qquad (9)$$

This equation is of the same as Equation 3 and temperature compensation of transistor 14 is accomplished when:

$$(R_1+R_b)I_T\cong I_a/K_a \qquad (10)$$

and $$E_{bb}-E_{cc}\cong C_a \qquad (11)$$

Simultaneous solution of Equations 5, 6, and 7 also provides the following equation for emitter current:

$$I_e=\frac{(E_{bb}-E_{cc})+R_bI_T\epsilon^{B(T-T_R)}}{R_1+R_b(1-\alpha)} \qquad (12)$$

When the current gain $\alpha$ is very nearly equal to unity, Equation 12 may be re-arranged to provide an expression for the compensating voltage $e_b$:

$$e_b=I_eR_1\cong R_bI_T\epsilon^{B(T-T_R)}+(E_{bb}-E_{cc}) \qquad (13)$$

This equation is of the same form as Equation 4 and the temperature compensation of transistor 16 is achieved when:

$$R_bI_T\cong\frac{I_b}{K_b} \qquad (14)$$

and $$E_{bb}-E_{cc}\cong C_b \qquad (15)$$

It is apparent that proper temperature compensation for both transistors can be achieved by the proper selection of $E_{cc}$ and resistance $R_b$ when:

$$C_a\cong C_b \qquad (16)$$

as derived from Equations 11 and 15 and when:

$$I_a/K_b\cong I_b/K_b \qquad (17)$$

as derived from Equations 10 and 14 and being realized when $R_1$ is small relative to $R_b$. The value of $R_b$ is effective to determine the slope of the temperature compensation curve and when properly selected, both transistors are compensated to render the output currents independent of temperature variations.

Although the description of this invention has been given with respect to a particular embodiment, it is not to be construed in a limiting sense. Numerous variations and modifications within the spirit and scope of the invention will now occur to those skilled in the art. For a definition of the invention, reference is made to the appended claims.

I claim:

1. In combination, a two channel amplifier comprising a PNP transistor having base, emitter and collector electrodes and an NPN transistor having base, emitter and collector electrodes, a voltage source, bias voltage and signal voltage developing means connected with the voltage source and connected with the base electrodes of the transistors, a first load device connected effectively between one terminal of the voltage source and the collector electrode of the NPN transistor and a second load device connected effectively between the other terminal of the voltage source and the collector electrode of the PNP transistor, a temperature compensating transistor having emitter, base and collector electrodes, a pair of voltage dividing resistors connected across the voltage source, a base resistor connected between the junction of the voltage dividing resistors and the base electrode of the compensating transistor, a first resistor connected between one terminal of the voltage source and the emitter electrode of the compensating transistor and the PNP transistor, a second resistor connected between the other terminal of the voltage source and the collector electrode of the compensating transistor and the emitter electrode of the NPN transistor, said compensating transistor being of the PNP type and all of the transistors having similar temperature characteristics whereby the currents through the load devices are independent of temperature variations.

2. The combination defined in claim 1 wherein said temperature compensating transistor has a current gain approximately equal to one and said first and second resistors are equal to each other.

3. A temperature compensated transistor amplifier comprising a PNP transistor and an NPN transistor each having emitter, base and collector electrodes, an input circuit for the NPN transistor including a signal voltage source and a first resistor connected serially between the base and one of the other electrodes thereof, an input circuit for the PNP transistor including the signal voltage source and a second resistor connected serially between the base and one of the other electrodes thereof, a supply voltage source, an output circuit for the NPN transistor including a load device, the supply voltage source and the first resistor connected in series between the collector electrode and one of the other electrodes thereof, an output circuit for the NPN transistor including a load device, the supply voltage source and the second resistor connected in series between the collector electrode and one of the other electrodes thereof, a temperature compensating transistor having emitter, base and collector electrodes, an input circuit including a bias voltage source connected between the base and the emitter electrodes of the temperature compensating transistor, an output circuit including the supply voltage source and the first and second resistors serially connected between the emitter and collector electrodes of the temperature compensating transistor, one of the resistors being connected between one terminal of the supply voltage source and the emitter electrode of the temperature compensating transistor, the other of the resistors being connected between the other terminal of the supply voltage source and the collector electrode of the temperature compensating transistor, the more positive one of the last-mentioned emitter and collector electrodes being connected to the emitter electrode of the PNP transistor and the less positive one of the last-mentioned emitter and collector electrodes being connected to the emitter electrode of the NPN transistor, said transistors having similar temperature characteristics whereby the output currents of the PNP transistor and the NPN transistor are independent of temperature change.

4. The circuit defined by claim 3 wherein said temperature compensating transistor has a current gain approximately equal to one and the first and second resistors are equal to each other.

References Cited in the file of this patent

UNITED STATES PATENTS 2,761,917 Aronson ---------------- Sept. 4, 1956

UNITED STATES PATENT OFFICE
CERTIFICATE OF CORRECTION

Patent No. 3,022,464 February 20, 1962

Robert B. Gelenius

It is hereby certified that error appears in the above numbered patent requiring correction and that the said Letters Patent should read as corrected below.

Column 3, line 74, for "$a_a$" read -- $e_a$ --; column 4, line 1, after "same" insert -- form --; line 32, equation (17) should appear as shown below instead of as in the patent:

$$I_a/K_a \cong I_b/K_b$$

Signed and sealed this 12th day of June 1962.

SEAL)
.ttest:

RNEST W. SWIDER
ttesting Officer

DAVID L. LADD
Commissioner of Patents